(12) United States Patent
Pinarbasi et al.

(10) Patent No.: US 8,771,419 B2
(45) Date of Patent: Jul. 8, 2014

(54) ROLL TO ROLL EVAPORATION TOOL FOR SOLAR ABSORBER PRECURSOR FORMATION

(75) Inventors: Mustafa Pinarbasi, Morgan Hill, CA (US); Bulent M. Basol, Manhattan Beach, CA (US)

(73) Assignee: Solopower Systems, Inc., San Jose, CA (US)

( * ) Notice: Subject to any disclaimer, the term of this patent is extended or adjusted under 35 U.S.C. 154(b) by 1063 days.

(21) Appl. No.: 11/868,443

(22) Filed: Oct. 5, 2007

(65) Prior Publication Data

US 2009/0092744 A1 Apr. 9, 2009

(51) Int. Cl.
*C23C 16/00* (2006.01)
(52) U.S. Cl.
USPC .............................. 118/718; 118/724; 118/729
(58) Field of Classification Search
USPC .................................................. 118/729, 718
See application file for complete search history.

(56) References Cited

U.S. PATENT DOCUMENTS

| | | | |
|---|---|---|---|
| 3,941,232 | A | 3/1976 | Parkes |
| 4,581,108 | A | 4/1986 | Kapur et al. |
| 5,626,688 | A | 5/1997 | Probst et al. |
| 5,994,163 | A | 11/1999 | Bodegard et al. |
| 6,092,669 | A | 7/2000 | Kushiya et al. |
| 6,129,951 | A * | 10/2000 | Ward-Close et al. .... 427/255.24 |
| 7,018,858 | B2 | 3/2006 | Aoki et al. |
| 2005/0235914 | A1* | 10/2005 | Yonezawa et al. ............ 118/718 |
| 2006/0096537 | A1 | 5/2006 | Tuttle |
| 2007/0163640 | A1 | 7/2007 | Van Duren et al. |

OTHER PUBLICATIONS

Bremaud, D., et al., "Towards the Development of Flexible CIGS Solar Cells on Polymer films with Efficiency Exceeding 15%", Photovoltaic Specialists Conference, 2005, Conference Record of the Thirty-first IEEE Jan. 3-7, 2005, pp. 223-226.
International Search Report issued Aug. 4, 2008 in corresponding PCT/US08/61784.
Bodegard, et al., "The Influence of Sodium on the Grain Structure of CIS Films for PV Applications", *Proc. of the 12th EP Photovoltaic Solar Energy Conf.*, Apr. 1994, p. 1743.
Granath, et al., "The Effect of NaF on Cu(In, Ga)Se$_2$ Thin Film Solar Cells", *Solar Energy Materials & Solar Cells*, vol. 60, 2000, pp. 279-293.
Hedstrom, et al., "ZnO/CdS/CIGS Thin Film Solar Cells With Improved Performance", *Proc. IEEE PV Specialists Conf.*, 1993, p. 364-371.

(Continued)

*Primary Examiner* — Joseph S Del Sole
*Assistant Examiner* — Erin Snelting (57) ABSTRACT

An evaporation tool for forming a dopant structure on a front surface of a continuous workpiece, wherein the front surface includes a precursor layer to form Group IBIIIAVIA absorbers for solar cells and the dopant structure is used to introduce dopants into the precursor layer. The tool includes at least a first vapor source station to deposit a Group VIA material, such as Se, and a second vapor station to deposit a dopant material, such as Na, onto the continuous workpiece. A moving assembly of the tool holds and moves the continuous workpiece within the tool by feeding the continuous workpiece from a first end and taking up from a second end of the tool. A support assembly of the tool contacts a back surface of the continuous workpiece to remove the heat from and apply tension to the continuous workpiece during the process.

10 Claims, 5 Drawing Sheets

(56) References Cited

OTHER PUBLICATIONS

Holz, et al., "The Effect of Substrate Impurities on the Electronic Conductivity in CIS Thin Films", *Proc. of the 12$^{th}$ EP Photovoltaic Solar Energy Conf.*, Apr. 1994, p. 1592-1595.

Kapur, "Low Cost Methods for the Production of Semiconductor Films for CuIuSe$_2$ / CdS Solar Cells", *Solar Cells*, vol. 21, 1987, pp. 65-72.

Rudmann, et al., "Sodium Incorporation Strategies for CIGS Growth at Different Temperatures", *Thin Solid Films*, vol. 480-481 p. 55-60, 2005.

Yun, et al., "Effect of Na-Doped No/Mo Bilayer on CIGS Cells and Its Photovoltaic Properties", *Proc. of 4$^{th}$ World Conf. PV Energy Conversion—IEEE*, p. 509-511, 2006.

\* cited by examiner

ROLL TO ROLL EVAPORATION TOOL FOR SOLAR ABSORBER PRECURSOR FORMATION

BACKGROUND OF THE INVENTION

The present invention generally relates to solar cell fabrication. More particularly, the present invention relates to systems and methods for preparing precursor thin films for the growth of semiconductor compounds to be used for radiation detector and solar cell fabrication.

DESCRIPTION OF THE RELATED ART

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. One way of reducing the cost of solar cell electricity generation is to develop low-cost thin film growth techniques that can deposit solar-cell-quality absorber materials on large area substrates and to fabricate these devices using high-throughput, low-cost methods.

Compounds of Copper (Cu), Indium (In), Gallium (Ga), Selenium (Se) and Sulfur (S) which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that have yielded conversion efficiencies approaching 20%. The structure of a conventional CIGS(S) photovoltaic cell is exemplified in FIG. 1. A device 10 is fabricated on a substrate 11, such as a sheet of glass, a sheet of metal, an insulating foil or web, or a conductive foil or web. An absorber film 12 which is a CIGS(S) layer is grown over a conductive layer 13, which was previously deposited on substrate 11 and which acts as the electrical contact for device 10. As will be mentioned below the CIGS layer may contain some dopant materials such as Na to improve its performance.

Figure 1:
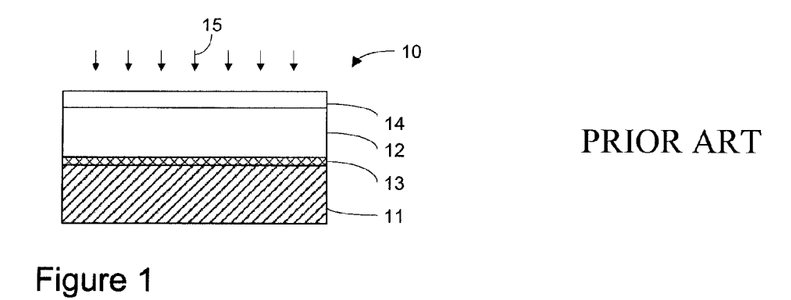
FIG. 1 is a schematic cross-sectional view of a solar cell employing a Group IBIIIAVIA absorber layer.

Various conductive layers comprising Molybdenum (Mo), Tantalum (Ta), Tungsten (W), Titanium (Ti), their nitrides and stainless steel have been used in the solar cell structure of FIG. 1. If substrate 11, itself, is a properly selected conductive material, it is possible not to use conductive layer 13, since substrate 11 may then be used as the ohmic contact to device 10. After absorber film 12 is formed, a transparent layer 14 such as a Cadmium Sulfide (CdS), Zinc Oxide (ZnO) or CdS/ZnO stack is formed on absorber film 12.

Radiation 15 enters device 10 through transparent layer 14. Metallic grids (not shown) may also be deposited over transparent layer 14 to reduce the effective series resistance of device 10. The typical electrical type of absorber film 12 is p-type, and the typical electrical type of transparent layer 14 is n-type. However, an n-type absorber and a p-type window layer can also be utilized. The typical device structure of FIG. 1 is called a "substrate-type" structure. A "superstrate-type" structure can also be constructed by depositing a transparent conductive layer on a transparent superstrate such as glass or transparent polymeric foil, and then depositing the CIGS(S) absorber film, and finally forming an ohmic contact to the device by a conductive layer. In this superstrate structure light enters the device from the transparent superstrate side. A variety of materials, deposited by a variety of methods, can be used to provide the various layers of device 10 shown in FIG. 1.

In a thin film solar cell employing CIGS(S) absorber layer, the cell efficiency is a strong function of the molar ratio of Cu/(In+Ga). The Ga/(In+Ga) molar ratio also affects the performance of the solar cell. For good device performance Cu/(In+Ga) molar ratio is kept at or below 1.0. As the Ga/(Ga+In) molar ratio is increased, on the other hand, the optical bandgap of the absorber layer increases increasing the open circuit voltage of the solar cell. Consequently, it is desirous, but not required, for a thin film deposition process to have the capability of controlling the above mentioned molar ratios.

One prior art method described in U.S. Pat. No. 4,581,108 utilized an electrodeposition approach for metallic precursor preparation and reaction of the metallic precursor with Se to form the compound. In this method a Cu layer was first electrodeposited on a substrate. This was then followed by electrodeposition of an In layer and heating of the deposited Cu/In stack in a reactive atmosphere containing Se. It was claimed that, through this approach thickness of individual constituent layers is independently controlled providing good compositional control for the overall film. In practice, however, this technique was found to yield $CuInSe_2$ films with poor adhesion to the Mo contact layer. In a publication ("Low Cost Methods for the Production of Semiconductor Films for $CuInSe_2$/CdS Solar Cells", Solar Cells, vol: 21, p. 65, 1987) electrodeposition and selenization of Cu/In and Cu/In/Ga layers were demonstrated for CIS and CIGS growth. One problem area was identified as peeling of the compound films. The cross-section of $Mo/CuInSe_2$ interface obtained by SEM clearly showed a weak interface.

Another conventional technique used for CIGS(S) formation involves sputter deposition of Cu—Ga alloy followed by sputter deposition of an In layer to obtain a (Cu—Ga alloy/In) precursor stack on the Mo back contact (see U.S. Pat. No. 6,092,669). The stack is then reacted with selenium and/or sulfur to form the compound. This approach has the drawback of high cost. Material utilization in a sputtering technique is much lower than 100% and Cu—Ga target preparation is costly.

The absorber layer 12, such as a CIGS(S) layer, shown in FIG. 1 may contain other trace elements, such as Na to enhance cell performance, in addition to the primary elements (Cu, In, Ga, Se and/or S) required to form the absorber layer. In cells with Glass (soda lime) substrates, desired Na doping can be achieved by Na diffusion into the absorber layer during absorber formation. However, adding a small amount of Na into absorber layers on non glass substrates, such as steel, polymers, has proven to be difficult.

Prior research on possible dopants for Group IBIIIAVIA compound layers have shown that alkali metals, such as Na, K, and Li, affect the structural and electrical properties of such layers. Especially, inclusion of Na in CIGS layers was shown to be beneficial for their structural and electrical properties and for increasing the conversion efficiencies of solar cells fabricated on such layers provided that its concentration is well controlled. Beneficial effects of Na on CIGS layers were recognized in early 1990s (see for example, J. Hedstrom et al., "ZnO/CdS/CIGS thin film solar cells with improved performance", Proceedings of IEEE PV Specialists Conf., 1993, p. 364; M. Bodegard et al., "The influence of sodium on the grain structure of CIS films for PV applications", Proceedings of the 12th European Photovoltaic Solar Energy Conference, April-1994, p. 1743; and J. Holz et al., "The effect of substrate impurities on the electronic conductivity in CIS thin films", Proceedings of the 12th European Photovoltaic Solar Energy Conference, April-1994, p. 1592). Inclusion of Na into CIGS layers was achieved by various ways. For example, Na was diffused into the forming CIGS layer from the substrate if the CIGS film was grown on a Mo contact layer deposited on a Na-containing soda-lime glass substrate. This approach, however, is hard to control and causes non-uniformities in the CIGS layers depending on how much Na diffuses from the substrate through the Mo contact layer. Therefore the amount of Na doping is a strong function of the nature of the Mo layer such as its grain size, crystalline structure, chemical composition, thickness, etc. In another approach (see for example, U.S. Pat. Nos. 5,994,163 and 5,626,688), Na is added into the CIGS layers intentionally, in a specific manner. In one approach, a diffusion barrier is deposited on the soda-lime glass substrate to stop possible Na diffusion from the substrate into the absorber layer. A Mo contact film is then deposited on the diffusion barrier. An interfacial layer comprising Na is formed on the Mo surface. The CIGS film is then grown over the Na containing interfacial layer. During the growth period, Na from the interfacial layer gets included into the CIGS layer and dopes it. Therefore, this approach uses a structure where the source of Na is under the CIGS layer at the CIGS/Mo interface. The most commonly used interfacial layer material is NaF, which is deposited on the Mo surface before the deposition of the CIGS layer by the co-evaporation technique (see, for example, Granath et al., Solar Energy Materials and Solar Cells, vol: 60, p: 279 (2000)). It should be noted that effectiveness of a Na-diffusion barrier for limiting Na content of a CIGS layer was also disclosed in the papers by M. Bodegard et al., and J. Holz et al., cited above.

U.S. Pat. No. 7,018,858 describes a method of fabricating a layer of CIGS wherein an alkali layer is formed on the back electrode (typically Mo) by dipping the back electrode in an aqueous solution containing alkali metals, drying the layer, forming a precursor layer on the alkali layer and heat treating the precursor in a selenium atmosphere. The alkali film formed by the wet treatment process on the Mo electrode layer is said to contain moisture and therefore it is stated that it can be free from such troubles that a dry film formed by a dry process may run into, such as absorbing moisture from the surrounding air with the result of deteriorating and the peeling of the layer. The hydration is claimed to enable the alkali film to keep moisture that can be regulated by the baking or drying treatment.

Another method of supplying Na to the growing CIGS layer is depositing a Na-doped Mo layer on the substrate, following this by deposition of an un-doped Mo layer and growing the CIGS film over the undoped Mo layer. In this case Na from the Na-doped Mo layer diffuses through the undoped Mo layer and enters the CIGS film during high temperature growth (J. Yun et al., Proc. $4^{th}$ World Conf. PV Energy Conversion, p. 509, IEEE, 2006). Various strategies of including Na in CIGS type absorbers are summarized in a recent publication by Rudmann et al., (Thin Solid Films, vol. 480-481, p. 55, 2005). These approaches are categorized into two main approaches; i) deposition of a Na-bearing interface film over the contact layer followed by CIGS layer growth over the Na-bearing interface film, and ii) formation of a CIGS layer on a Na-free base followed by deposition of a Na-bearing film on the CIGS layer and high temperature annealing to drive the Na into already formed CIGS layer.

As the brief review above demonstrates, there is still a need to develop an effective process to form doped compound layers for high performance solar cells.

SUMMARY OF THE INVENTION

The present invention provides an evaporation system to deposit a dopant structure on a precursor layer formed on a surface of a continuous workpiece. The dopant structure is vapor deposited onto the precursor layer as the precursor layer on the continuous workpiece is moved within the system that includes multiple evaporation sources.

Accordingly, an aspect of the present invention provides a system for forming a dopant structure on a front surface of a continuous workpiece. The front surface of the continuous workpiece includes a precursor layer to form an absorber for a solar cell and the dopant structure is used to add a dopant material into the absorber. The system includes a process chamber, a moving assembly to hold and move the continuous workpiece within the process chamber, and a support assembly contacting a back surface of the continuous workpiece while avoiding touching the front surface. The process chamber includes a first vapor source station to deposit a Group VIA material and a second vapor station to deposit a Group IA material onto the front surface. The moving assembly holds and moves the continuous workpiece over the first and second vapor source stations by feeding the continuous workpiece from a first end of the process chamber and taking up from a second end of the process chamber. The support assembly removes the heat from and applies tension to the continuous workpiece.

Another aspect of the present invention provides a process of forming a dopant structure on a front surface of a continuous workpiece using a system including a moving assembly and a process chamber having a support assembly and at least two vapor source stations. The front surface includes a precursor layer to form absorbers for solar cells. The process includes moving the continuous workpiece within the process chamber and over the at least two vapor source stations using the moving assembly, forming a dopant structure on the front surface, and applying the support assembly to a back surface of the continuous workpiece. The dopant structure includes a Group VIA material layer formed by depositing a Group VIA material from a first vapor source station and a Group IA material layer formed by depositing a Group IA material from a second vapor source station. Application of the support assembly to the back surface cools and tensions the continuous workpiece while depositing the Group VIA and Group IA materials.

Another aspect of the present invention provides a process of forming a dopant structure on a front surface of a continuous workpiece using a system including a moving assembly and a process chamber having a support assembly and at least two vapor source stations. The front surface includes a precursor layer to form absorbers for solar cells. The process includes moving the continuous workpiece within the process chamber and over the at least two vapor source stations using the moving assembly, co-depositing a Group VIA material from a first vapor source station and a Group IA material from a second vapor source station to form a layer on the front surface of the continuous workpiece, and applying the support assembly to a back surface of the continuous workpiece. The co-deposited layer includes both the Group VIA and Group IA materials. Application of the support assembly to the back surface cools and tensions the continuous workpiece while depositing the Group VIA and Group IA materials so that complete reaction of the precursor with the Group VIA and Group IA materials is avoided.

DETAILED DESCRIPTION

The present invention provides a method and apparatus to form multilayer structures of precursors used in manufacture of solar cells. Further, the present invention provides a process to introduce one or more dopant materials into a precursor layer to manufacture doped absorbers for solar cells. In one embodiment, dopant materials are introduced through a dopant structure formed on a precursor layer or precursor structure. When the combined structure of the dopant structure and the underlying precursor layer, which may be called a pre-absorber structure, are annealed, thus forming a doped absorber. The dopant structure includes doping elements as a layer or a stack of layers. Accordingly, the dopant structure may be formed as a dopant layer containing dopant elements such as sodium (Na) or as a dopant stack having one or more dopant layers and one or more layers of a Group VIA element, such as selenium (Se).

The dopant structure of the present invention may be formed on a precursor layer using a system of the present invention. By this system, the dopant structure may be formed on the precursor layer as the precursor layer on a substrate passes through a process chamber of the system which may include multiple vaporization or evaporation sources. In the process chamber, the surface of the precursor layer may be exposed to a first vapor from at least one vapor source containing alkaline or group VIA elements to form a first material layer of the dopant structure on the precursor layer. Thereafter, the substrate is moved to expose the first material layer to a second vapor from a second vapor source and thereby to form a second material layer on the first material layer. For example, if the first material layer is a Group VIA element containing layer, the second material layer may be a dopant element containing layer. In the process chamber, similarly, as the substrate is moved to other vapor sources such as a third and then a forth vapor source, a third material layer on the second material layer, and so on, can be formed as a part of the dopant structure. The third material layer may be another Group VIA element containing layer. As such, multiple layers may be formed by moving the substrate adjacent any one of the multiple vapor sources. Alternatively, the system may use a limited number of vapor sources, such as two vapor sources, and form the dopant structure by exposing the substrate multiple times to their vapor by moving the substrate between the two vapor sources.

The process of the present invention generally includes three stages. In a first stage of the inventive process, a precursor layer is initially prepared on a base. The precursor layer may be formed as a stack including layers of materials. In a second stage of the present invention a dopant structure including one or more layers of a dopant material with or without another material layer or layers is formed on the precursor layer. The precursor layer and the dopant structure together form a pre-absorber structure or pre-absorber stack. And, in a third stage, annealing of the pre-absorber structure forms a doped absorber layer or, in the art as often referred to as, a doped compound layer.

Although in the following, the present invention will be exemplified by a process for doping Group IBIIIAVIA compound layers for solar cell absorbers, the same principles may be used to dope any other layer to manufacture solar cell absorbers or any other purpose device. Accordingly, exemplary dopant materials may preferably be a Group IA material such as Na, K, Li, a Group IIA material or a Group VA material or any other possible dopant materials used in the semiconductor industry. In the following embodiments, the precursor layer or the precursor stack used may preferably be a substantially metallic precursor stack or layer, or a non-metallic precursor layer. It should be noted that the "substantially metallic precursor" means that the precursor is substantially made of Group IB materials, such as Cu, and Group IIIA materials such as Ga, In. A substantially metallic precursor may for example include one or more metallic phases comprising elemental metallic layers, and/or mixtures of metals such as Cu, In and Ga and/or their alloys such as Cu—Ga binary alloys, Cu—In binary alloys, Ga—In binary alloys and Cu—Ga—In ternary alloys. These metals and alloys may form about 100% metallic precursor phase if no Group VIA element, such as Se, is included in the constitution of the precursor.

The precursor may additionally contain Group VIA materials such as Se, however, in this case the Group VIA/(Group IB+Group IIIA) molar ratio should be less than about 0.5, preferably less than about 0.2, i.e. the Group IB and/or Group IIIB materials should not be fully reacted with the Group VIA materials. In above given exemplary molar ratios, a precursor layer with a molar ratio of 0.5 corresponds to 50% metallic and 50% non-metallic (such as Se and/or selenide) phase, and with a molar ratio of 0.2 includes 80% metallic phase and 20% non-metallic phase, if the precursor layer is partially reacted before forming the dopant sack thereon. A precursor layer having a Group VIA/(Group IB+Group IIIA) molar ratio which is higher than 0.5, preferably in the range of 0.8-1, will be called a non-metallic precursor layer. Accordingly a non-metallic precursor layer may include more than 50% non-metallic phase, preferably 80-100% non-metallic phase, which may be in the form of selenides (Cu-selenide, In-selenide, Ga-selenide etc). A non-metallic precursor layer can be obtained by reacting Group IB and Group IIIA elements with Group VIA elements. The following embodiments of the present invention, which will be described in connection with FIGS. 2A-6B, can be performed by employing the system of the present invention. In the following figures, various schematic illustrations of multilayer structures, representing various embodiments, are exemplified in side or cross-sectional views. Dimensions of the various layers are exemplary and are not drawn to scale.

Figure 2A:
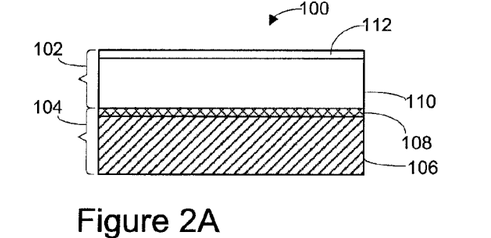
FIG. 2A is a schematic illustration of a pre-absorber structure of the present invention including a dopant layer formed on a precursor layer.
Figure 2B:
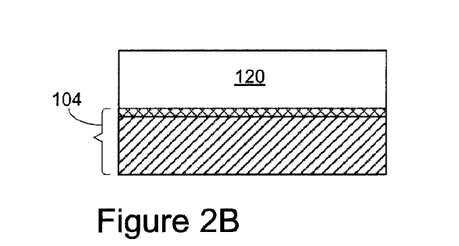
FIG. 2B is a schematic illustration of an absorber layer formed after reacting the pre-absorber structure shown in FIG. 2A.

As shown in FIG. 2A, in one embodiment, a multilayer stack 100 of the present invention includes a pre-absorber structure 102 formed on a base 104 including a substrate 106 and a contact layer 108. The pre-absorber structure 102 includes a precursor layer 110 and a dopant structure 112 comprising essentially a dopant bearing-film which is formed on top of the precursor layer 110. The dopant-bearing film 112 may be 2-100 nm thick, preferably 5-20 nm thick. In this and the following embodiments, a dopant-bearing film may comprise a Group IA material such as Na, K or Li, a Group IIA material or a Group VA material. This dopant-bearing film may preferably be a Na-fluoride, chloride, bromide, acetate, sulfide, selenide film or any other film that contains Na. In this embodiment, the precursor layer 110 may comprise at least one Group IB material and at least one Group IIIA material, which are deposited on the dopant-free base 104 forming a substantially metallic precursor layer. At least one dopant-bearing film 112 is then deposited over the metallic precursor layer 110 to complete the pre-absorber structure 102, which is a "metallic precursor/dopant-bearing film" stack. As shown in FIG. 2B, once completed, the multilayer stack 100 is heated up, in presence of additional Group VIA material species which may be in gas or vapor form to transform the pre-absorber stack 102 into an absorber layer 120 comprising a doped Group IBIIIAVIA semiconductor layer. During this reaction stage, the multilayer stack 100 may be annealed at a temperature range of 400-600 C for a period of time of about 5-60 minutes, preferably 10-30 minutes.

Alternatively, in another embodiment, the precursor layer 110 may comprise at least one Group IB material, at least one Group IIIA material and at least one Group VIA material, which are deposited on the dopant-free base 104. Following the deposition, the precursor layer containing the Group VIA material is partially reacted to form about more than 50-80% non-metallic phase in the precursor layer. The dopant bearing film 112 is deposited on this precursor layer and the rest of the process is performed as described above in FIG. 2A to form the doped Group IBIIIAVIA semiconductor layer 120 shown in FIG. 2B. During this reaction stage, the multilayer stack 100 may be annealed at a temperature range of 400-600 C for a period of time of about 5-60 minutes, preferably 10-30 minutes.

Figures 3A, 3B:
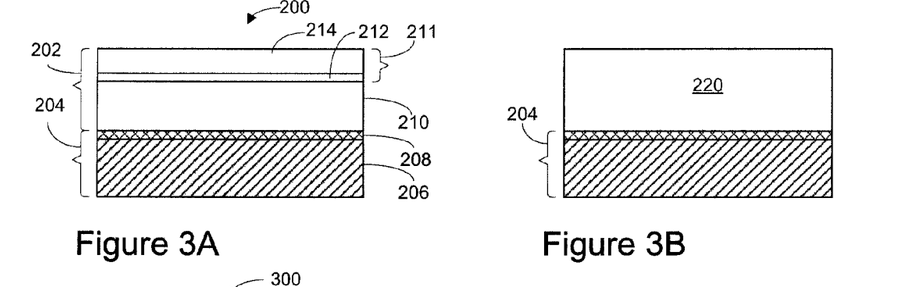
FIG. 3A is a schematic illustration of a pre-absorber structure of the present invention including a dopant stack formed on a precursor layer.
FIG. 3B is a schematic illustration of an absorber layer formed after reacting the pre-absorber structure shown in FIG. 3A.

As shown in FIG. 3A, in another embodiment, a multilayer stack 200 of the present invention includes a pre-absorber structure 202 formed on a base 204 including a substrate 206 and a contact layer 208. The pre-absorber structure 202 includes a precursor layer 210 and a dopant structure 211, which is essentially a dopant stack in this embodiment, including a first and a second layer 212 and 214, respectively, which are formed on top of the precursor layer 210. Accordingly the first layer 212 is a dopant-bearing film. The second layer 214, which is a cap layer for the first layer 212, comprises a Group VIA material such as Se. The dopant-bearing film 212 may be 2-100 nm thick, preferably 5-20 nm thick. The cap layer 214 may be 200-2000 nm thick, preferably 500-1500 nm tick. In this embodiment, the precursor layer 210 may comprise at least one Group IB material, and at least one Group IIIA material, which are deposited on the dopant-free base 204 forming a substantially metallic precursor layer. At least one first layer 212 or dopant-bearing film is then deposited over the metallic precursor layer 210 forming a "metallic precursor/dopant-bearing film" stack. Subsequently, at least one second layer 214 or cap layer which may comprise a Group VIA material is then deposited over the dopant-bearing film 212 to complete the pre-absorber structure 202, which is a "metallic precursor/dopant-bearing film/Group VIA material layer" stack. As shown in FIG. 3B, the multilayer stack 200 is heated up to transform the pre-absorber stack 202 into an absorber layer 220 comprising a doped Group IBIIIAVIA semiconductor layer. Additional Group VIA material species may be present during the heating period. During this reaction stage, the multilayer stack 200 may be annealed at a temperature range of 400-600 C for a period of time of about 5-60 minutes, preferably 10-30 minutes.

Figures 4A, 4B:
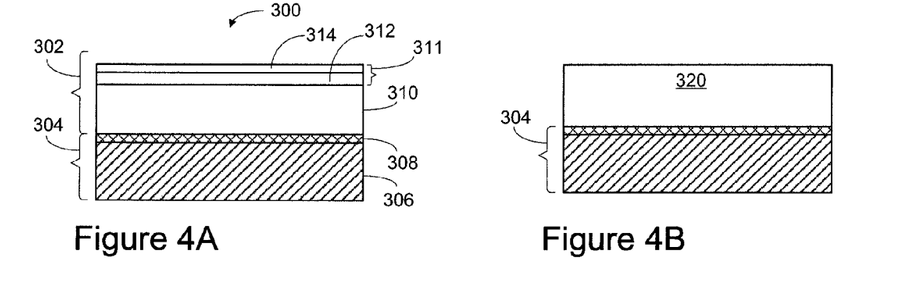
FIG. 4A is a schematic illustration of a pre-absorber structure of the present invention including a dopant stack formed on a precursor layer.
FIG. 4B is a schematic illustration of an absorber layer formed after reacting the pre-absorber structure shown in FIG. 4A.

As shown in FIG. 4A, in another embodiment, a multilayer stack 300 of the present invention includes a pre-absorber structure 302 formed on a base 304 including a substrate 306 and a contact layer 308. The pre-absorber structure 302 includes a precursor layer 310 and a dopant structure 311, which is essentially a dopant stack in this embodiment, including a first and a second layer 312 and 314, respectively, which are formed on top of the precursor layer 310. Accordingly, the first layer 312, which is essentially a buffer layer for the second layer 314, comprises a Group VIA material. The second layer 314 is a dopant-bearing film. The buffer layer 312 may be 50-500 nm thick, preferably 100-300 nm thick. The dopant-bearing film 314 may be 2-100 nm thick, preferably 5-20 nm thick. In this embodiment, the precursor layer 310 may comprise at least one Group IB material, and at least one Group IIIA material, which are deposited on the dopant-free base 304 forming a substantially metallic precursor layer. At least one first layer 312 or a buffer layer comprising a Group VIA material such as Se is deposited over the metallic precursor layer 310 forming a "metallic precursor/Group VI material layer" stack. Subsequently, at least one second layer 314 which is a dopant-bearing film is then deposited on the Group VI material layer to complete the pre-absorber structure 302, which is a "metallic precursor/Group VIA material layer/dopant-bearing film/" stack. As shown in FIG. 4B, the multilayer stack 300 is heated up to transform the pre-absorber stack 302 into an absorber layer 320 comprising a doped Group IBIIIAVIA semiconductor layer. Additional Group VIA material species may be present during the heating period. During this reaction stage, the multilayer stack 300 may be annealed at a temperature range of 400-600 C for a period of time of about 5-60 minutes, preferably 10-30 minutes.

Figure 5A:
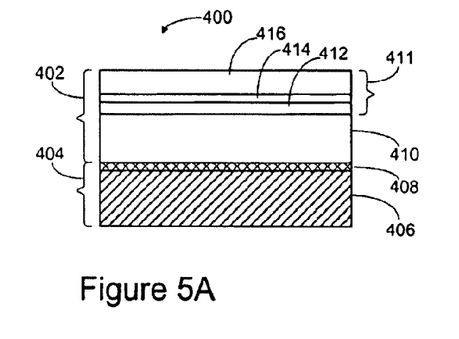
FIG. 5A is a schematic illustration of a pre-absorber structure of the present invention including a dopant stack formed on a precursor layer.

As shown in FIG. 5A, in another embodiment, a multilayer stack 400 of the present invention includes a pre-absorber structure 402 formed on a base 404 including a substrate 406 and a contact layer 408. The pre-absorber structure 402 includes a precursor layer 410 and a dopant structure 411, which is essentially a dopant stack in this embodiment, including a first, second and third layers 412, 414 and 416, respectively, which are formed on top of the precursor layer 410. Accordingly the first and third layers 412 and 416, which are essentially a buffer layer and a cap layer, respectively, for the second layer, comprise a Group VIA material such as Se. The second layer 414, which is a dopant-bearing film sandwiched between the first and third layers. The buffer layer 412 may be 50-500 nm thick, preferably 100-300 nm thick. The dopant-bearing film 414 may be 2-100 nm thick, preferably 5-20 nm thick. The cap layer 416 may be 200-2000 nm thick, preferably 500-1500 nm thick. In this embodiment, the precursor layer 410 may comprise at least one Group IB material, and at least one Group IIIA material, which are deposited on the dopant-free base 404 forming a substantially metallic precursor layer. At least one first layer 412 or a buffer layer which may comprise a Group VIA material is then deposited over the metallic precursor layer forming a "metallic precursor/Group VIA material layer" stack.

Figure 5B:
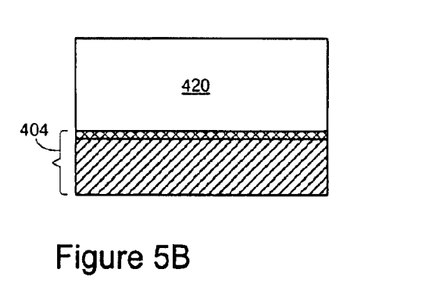
FIG. 5B is a schematic illustration of an absorber layer formed after reacting the pre-absorber structure shown in FIG. 5A.

In the following step, at least one second layer 414 or dopant-bearing film is then deposited over the Group VIA material layer forming a "metallic precursor/Group VIA material layer/dopant-bearing film" stack. Finally, at least one third layer 416 or a cap layer which may comprise a Group VIA material is then deposited over the dopant-bearing film 414 to complete the pre-absorber structure 402, which is a "metallic precursor/Group VIA material layer/dopant-bearing film/Group VIA material layer" stack. As shown in FIG. 5B, the multilayer stack 400 is heated up to transform the pre-absorber stack 402 into an absorber layer 420 comprising a doped Group IBIIIAVIA semiconductor layer. Additional Group VIA material species may be present during the heating period. In this embodiment, although the dopant stack is exemplified with three layers, stacks with more than three layers, while at least one being the dopant bearing layer, may be used. During this reaction stage, the multilayer stack 400 may be annealed at a temperature range of 400-600 C for a period of time of about 5-60 minutes, preferably 10-30 minutes.

Figure 6A:
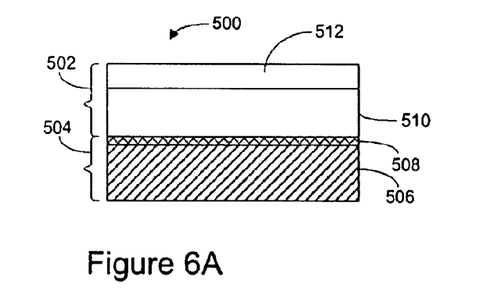
FIG. 6A is a schematic illustration of a pre-absorber structure of the present invention including a dopant carrying layer formed on a precursor layer.
Figure 6B:
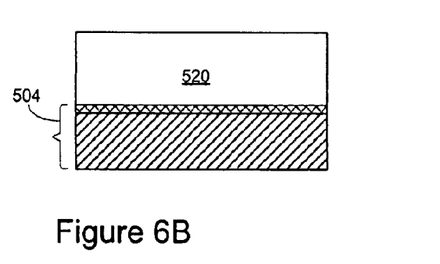
FIG. 6B is a schematic illustration of an absorber layer formed after reacting the pre-absorber structure shown in FIG. 6A.

As shown in FIG. 6A, in one embodiment, a multilayer stack 500 of the present invention includes a pre-absorber structure 502 formed on a base 504 including a substrate 506 and a contact layer 508. The pre-absorber structure 502 includes a precursor layer 5 10 and a dopant structure 512, which is essentially a dopant carrier layer, comprising a doped Group VIA material layer which is formed on top of the precursor layer 510. In the dopant carrier layer 512, the dopant species are held in the Group VI material matrix. The dopant carrier layer 512 may be 250-2600 nm thick, preferably 600-1800 nm thick. In this embodiment, the precursor layer 510 may comprise at least one Group IB material, and at least one Group IIIA material, which are deposited on a dopant-free base forming a substantially metallic precursor layer. At least one dopant is then deposited together with at least one Group VIA material layer over the metallic precursor layer forming a "metallic precursor/dopant-bearing Group VIA material layer" stack. As shown in FIG. 6B, the multilayer stack 500 is then heated up to transform the pre-absorber stack 502 into an absorber layer 520 comprising a doped Group IBIIIAVIA semiconductor layer. Additional Group VIA material species may be present during the heating period. During this reaction stage, the multilayer stack 500 may be annealed at a temperature range of 400-600 C for a period of time of about 5-60 minutes, preferably 10-30 minutes.

Figure 7:
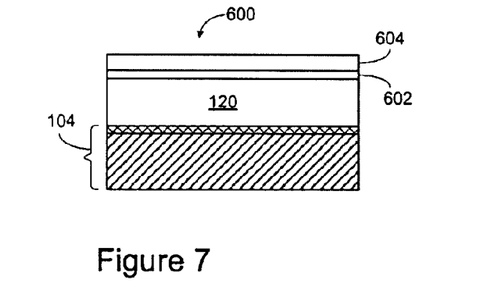
FIG. 7 is a schematic illustration of a solar cell manufactured using an embodiment of the present invention.

FIG. 7 shows a solar cell 600 by further processing any one of the above described absorber layers, for example, absorber layer 120 shown in FIG. 2B. Solar cells may be fabricated on the absorber layers of the present invention using materials and methods well known in the field. For example a thin CdS layer 602 may be deposited on the surface of the absorber layer 120 using the chemical dip method. A transparent window 604 of ZnO may be deposited over the CdS layer using MOCVD or sputtering techniques. A metallic finger pattern (not shown) is optionally deposited over the ZnO to complete the solar cell. In all of the above examples, the substrate may be a flexible metallic substrate such as a steel web substrate having a thickness about 25-125 micrometers, preferably 50-75 micrometers. Similarly, the contact layer comprising any Mo, W, Ru, Os or Ir, etc. may be 200-1000 nm thick, preferably 300-500 nm thick. The above given precursor layers or stacks may have a thickness in the range of 400-1000 nm, preferably, 500-700 nm.

As will be described more fully below, preferably, the precursor layer may be supplied into a system of the present invention, on a flexible substrate material which may be a roll of continuous flexible material. The precursor layer may be formed by electroplating Group IB and IIIA materials on the flexible substrate material in an electroplating system. In the present system, the dopant structure is formed on the precursor layer, as described above, as the substrate advances through the process chamber. The process continues until the entire roll is unwound and processed to form the dopant structure and a pre-absorber structure. In a following process step, the pre-absorber structure is reacted to obtain a doped absorber layer.

Figure 8A:
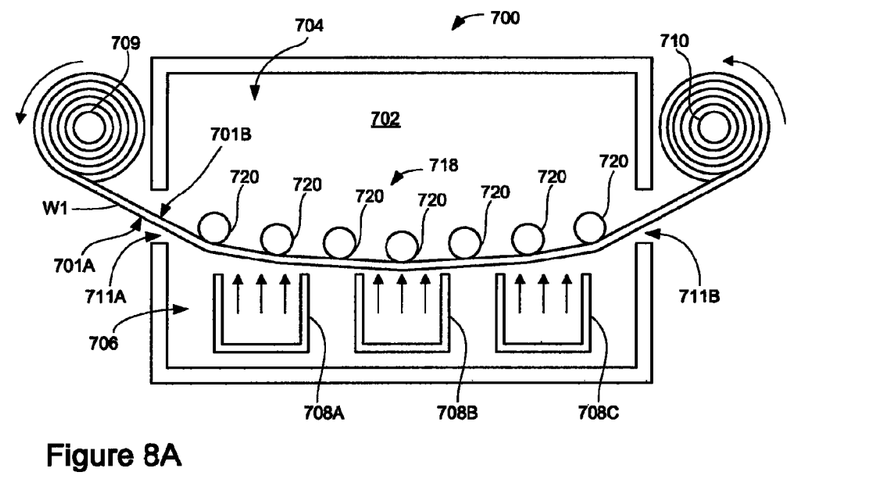
FIG. 8A is a schematic illustration of an embodiment of a deposition system of the present invention to form a dopant structure on a continuous workpiece.
Figure 8B:
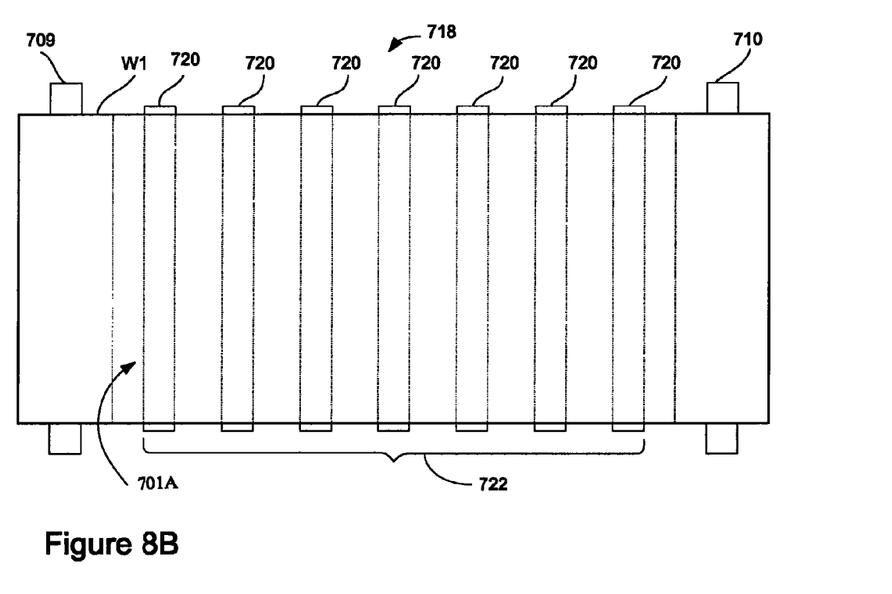
FIG. 8B is a schematic illustration of a portion of a front surface of the continuous workpiece shown in FIG. 8A while the continuous workpiece has been processed in the system.

FIGS. 8A-8B exemplify an embodiment of a system of the present invention to form the dopant structures shown in FIGS. 2A, 3A, 4A, 5A and 6A. The systems described below are multi section roll to roll evaporation tools to process precursor layers or stacks formed on a flexible continuous substrate, which is supplied as a roll.

FIG. 8A is a schematic illustration of a system 700 of the present invention to form the above described dopant structures on a continuous workpiece W1, which is in this embodiment shaped as a continuous sheet structure or laminate, with the process of the present invention. The workpiece W1 includes a front surface 701A and a back surface 701B. In its unprocessed state, the front surface 701A of the workpiece W1 contains a precursor layer, as described in the above embodiments with regard to FIGS. 2A, 3A, 4A, 5A and 6A, on which a dopant structure will be formed by the system 700. The back surface 701B of the workpiece W1 may be a flexible substrate, such as a stainless steel web described in the above embodiments. There may be a contact layer, such as a Mo, W, Ru, Ir, Os, etc., layer interposed between the precursor layer and the steel substrate.

Referring back to FIG. 8A, the system 700 includes a process chamber 702 having a first section 704 and a second section 706 positioned under the first section 704. A number of vapor source stations, namely a first station 708A, a second station 708B and a third station 708C, may be placed in the second section 706. The vapor source stations 708A, 708B and 708C provide source materials, such as Group IA, Group IIA and VIA materials, to form a dopant structure on the front surface 701A of the workpiece W1 or process the workpiece W1. In the following description, processing the workpiece W1 will generally refer to forming a dopant structure on the front surface 701A of the workpiece W1. The dopant structure serves two purposes: it includes the dopant material for the subsequent reaction step to form the absorber; and, it provides a top protective surface for the underlying precursor layer.

Use of three vapor source stations is exemplary, the system 700 may include one or more vapor source stations depending on the type of dopant structure desired. In one example, the first station 708A may generate a Group VIA material vapor, the second station 708B a Group IA vapor and the third station 708C again the Group VIA material vapor. In operation, all three stations or less then three of them may be activated at the same time or activated sequentially to form the desired dopant structures. During the process, the process chamber is kept under a pressure range of $10^{-4}$-$10^{-6}$ Torr. Application of this particular pressure range is one of the reasons that the production of the precursor layer and the production of the dopant structure may not be integrated and performed in the same system. Because the precursor layer or stack can be electrochemically formed under atmospheric process conditions.

The system 700 further includes a workpiece moving assembly comprising a feed roller 709 and a take-up roller 710, which are positioned adjacent both ends of the process chamber 702. There are enclosures around the workpiece moving assembly for keeping vacuum in the process chamber 702, but this is not shown in the figure to simplify the drawing. The workpiece W1 is processed in the process chamber 702 while it is extended through the process chamber and between the feed roller 709 and the take-up roller 710. An unprocessed portion of the workpiece W1 is wrapped around the feed roller 709 while the processed portion of the workpiece W1 is wrapped around the take-up roller 710. The workpiece W1 enters the process chamber 702 through the first opening 711A of the process chamber 702 and leaves the process chamber through the second opening 711B. In operation, the continuous workpiece W1 is unwrapped from the feed roller 709, advanced over the vapor source stations 708A, 708B, 708C to vapor deposit the dopant structure layer or layers, and wrapped around the take-up roller 710. Presence of dopant stack on the precursor layer comprising Cu, In and Ga has advantages. One such advantage is the protection provided by the dopant structure to the surface of the metallic precursor. Indium and Ga are soft, low melting materials and they are vulnerable to easy scratching during rolling and handling. By forming a dopant structure on the precursor this vulnerability is reduced or eliminated so that the flexible web may be rolled onto the take-up roller safely. As the continuous workpiece W1 is wrapped around the take-up roller 710, only the top protective surface provided by the dopant structure comes into contact with the back surface 701B of the continuous workpiece W1, thereby protecting the underlying precursor stack.

During the process, the workpiece W1 may be advanced incrementally or continuously by a moving mechanism (not shown) which controls the movement of the workpiece W1. For example, the take up roller 710 may be coupled to a drive motor (not shown) to rotate the take up roller 710 to wrap the workpiece around it and hence advancing the workpiece W1. The feed roller 709 meantime can be coupled to an adjustable clutch which cooperates with the drive motor to advance the workpiece W1 into the process chamber 702 by releasing it from the feed roller 709 while maintaining workpiece W1 in a state of tension, and while preventing the feed roller 709 from rotating backwards.

Figure 8C:
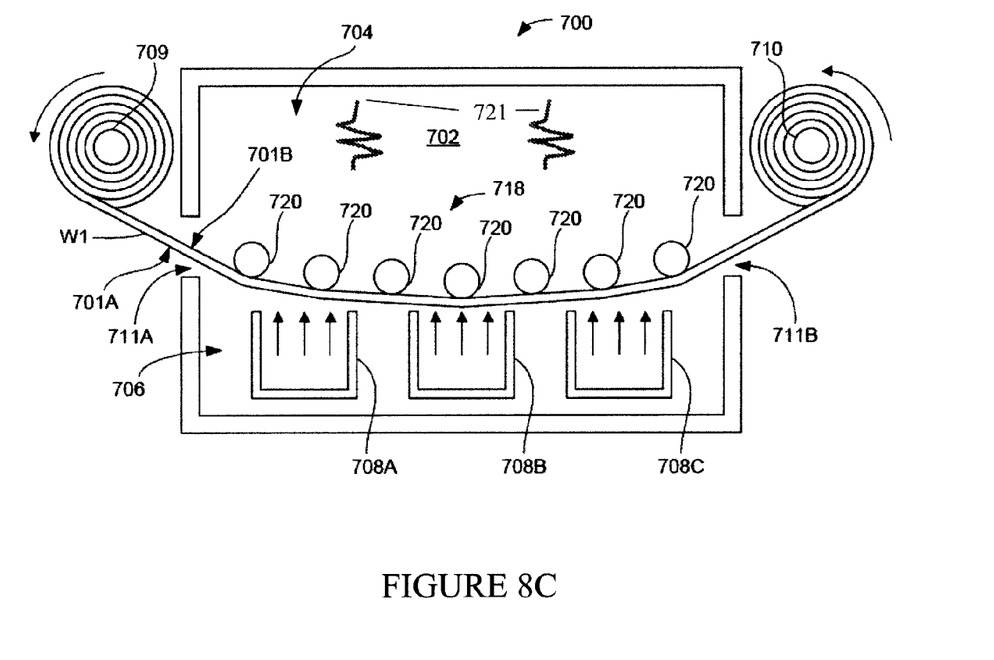
FIG. 8C is a schematic illustration of the embodiment of FIG. 8A that also includes a series of springs as the bias system.

The system 700 of the present invention further includes a support assembly comprising a chiller 718 to cool down the workpiece W1 as it is processed in the process chamber 702. In this embodiment, the chiller may be for example comprised of a series of rollers 720 which are aligned along a curved path to curve the sheet member as it travels between the rolls 709 and 710. The rollers 720 may be connected to a cooling system. The rollers 720 may rotate about their major axes which are perpendicular to the plane of paper in FIG. 8A. As the workpiece W1 is moved through the process chamber, the back surface 701B of the workpiece W1 is contacted by the rollers 720 and the workpiece W1 is biased downwardly. In order to perform the biasing function the rollers 720 may be biased by a biasing system, for example a series of springs 721 as shown in FIG. 8(C) or the like. Combination of motion of the workpiece and the physical contact between the back surface 701B and the rollers 720, rotate the rollers and smoothly moves the workpiece over the vapor source stations while cooling the web or the workpiece. The tension applied by the rollers 720 takes up any slack which may occur due to the heat and keeps the front surface 701A of the continuous workpiece W1 at a predetermined distance from the vapor source stations, which is important for the uniformity of depositing layers. Although the curved path imposed by the configuration of rollers allows the sheet material to be tensioned and cooled more affectively within the process chamber, the rollers 720 may be aligned along a straight path or other alignment and such configuration is also within the scope of this invention. In the process chamber, cooling of the continuous workpiece W1 by the chiller prevents any reaction within the precursor layer and the dopant structure. Cooling of the continuous workpiece W1 further prevents any reaction between the precursor layer and the dopant structure.

FIG. 8B shows the front surface 701A of the workpiece W1 as the workpiece is loaded into the system between the feed roller 709 and the take up roller 710 for processing as described above. As shown in FIG. 8B, a process region 722 of the front surface 701A, which is exposed to the vapor from the vapor stations 708A, 708B and 708C during the process, is generally a rectangular area. The rollers 720 rest on the back surface 701B of the workpiece as the workpiece is advanced. As the workpiece is moved an unprocessed section of the front surface 701A continuously merges into the process area 722 where it can be exposed to the vapors from the stations. As described above, as the continuous workpiece with the dopant structure is wrapped around the take-up roller 710, the back surface 701B of the continuous workpiece W1 contacts only the dopant structure. This in turn protects the precursor layer under the dopant structure.

As mentioned above the system of the present invention can be employed to form the dopant structures shown in FIGS. 2A, 3A, 4A, 5A and 6A. Referring to FIGS. 2A and 8A, in one exemplary process sequence, assuming that the continuous workpiece W1 includes the base 104 and the substantially metallic precursor layer 110 on the front surface 701A, the dopant structure 112 or layer may be manufactured in the system 700 in the following manner. During the process, Na containing vapor such as a NaF vapor from the vapor source station 708B is deposited on the metallic precursor layer 110 to form the Na layer on the precursor. Process conditions and required data of this process are given with regard to the FIGS. 2A and 8A.

Referring to FIGS. 3A and 8A, in another exemplary process sequence, assuming that the continuous workpiece W1 includes the base 204 and the metallic precursor layer 210 on the front surface 701A, the dopant structure 211 or stack may be manufactured in the system 700 in the following manner. During the process, first, Na containing vapor from the vapor source station 708B is deposited on the precursor layer to form the Na containing layer on the precursor layer; second, Se vapor from the vapor source station 708C is deposited on the Na containing layer to form the dopant stack. Process conditions and required data of this process are given with regard to the FIGS. 3A and 8A.

Referring to FIGS. 4A and 8A, in another exemplary process sequence, assuming that the continuous workpiece W1 includes the base 304 and the metallic precursor layer 310 on the front surface 701A, the dopant structure 311 or stack may be manufactured in the system 700 in the following manner. During the process, first, Se vapor from the vapor source station 708A is deposited on the metallic precursor layer 310 to form the Se layer on the precursor layer; second, Na containing vapor from the vapor source station 708B is deposited on the Se layer to form the Na containing layer to form dopant stack. Process conditions and required data of this process are given with regard to the FIGS. 4A and 8A.

Referring to FIGS. 5A and 8A, in another exemplary process sequence, assuming that the continuous workpiece W1 includes the base 404 and the metallic precursor layer 410 on the front surface 701A, the dopant structure 411 or stack may be manufactured in the system 700 in the following manner. During the process, first, Se vapor from the vapor source station 708A is deposited on the metallic precursor layer 410 to form the Se layer on the precursor layer; second, Na containing vapor from the vapor source station 708B is deposited on the Se layer to form the Na containing layer; third, Se vapor from the vapor source station 708C is deposited on the Na containing layer to form the dopant stack. Process conditions and required data of this process are given with regard to the FIGS. 5A and 8A.

Referring to FIGS. 6A and 8A, in another exemplary process sequence, assuming that the continuous workpiece W1 includes the base 504 and the metallic precursor layer 3510 on the front surface 701A, the dopant structure 512 or layer may be manufactured in the system 700 in the following manner. During the process, Se vapor from the vapor source station 708A and Na containing vapor from the vapor source station 708B are co-deposited on the precursor layer to form the dopant carrier layer. Process conditions and required data of this process are given with regard to the FIGS. 6A and 8A.

Figure 9:
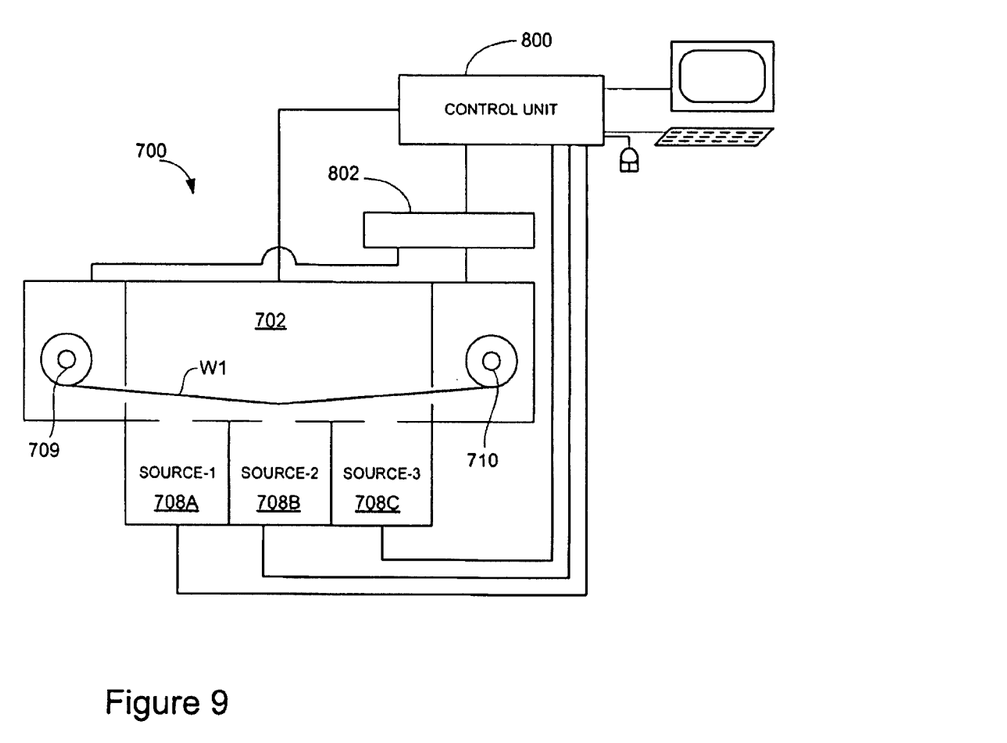
FIG. 9 is a schematic illustration of a control system of the deposition system shown in FIG. 8A.

As shown in FIG. 9, an exemplary control unit 800 may control the process flow in the system 700. The control unit 800 may include a processor chip, a memory device, and input and monitoring devices. The control unit 800 is electronically connected to the controls of process chamber, including the controls of vapor source stations, and the controls 802 of the moving assembly. As described above a moving mechanism is coupled to the take up roller 710 and the feed roller 709 and moves the work piece W1 as described above. The control unit further controls the vapor source stations during the process based on predetermined deposition time and conditions and workpiece speed. A process monitoring system including thickness monitoring detectors to in-situ monitor deposition process may also be connected to the control unit.

Although the invention may be practiced employing metallic precursor layers and layers of Group VIA materials formed by a variety of techniques such as sputtering, evaporation, ink deposition etc., the process of the present invention is especially suited for precursor layers formed by wet deposition techniques such as electrodeposition and electroless deposition. It should be noted that dopant-bearing layers such as NaF, NaCl, Na$_2$S, Na$_2$Se layers etc., are not conductors. Furthermore they are mostly soluble in solvents (such as water or organic liquids) used in electroplating and electroless plating baths or electrolytes. Therefore, the prior art approach of introducing a dopant into a Group IBIIIAVIA layer by depositing a dopant-bearing film over a base and growing the Group IBIIIAVIA layer over the dopant-bearing film presents problems. For example, if electroplating is used for the deposition of the Group IBIIIAVIA layer or for the deposition of a Group IB material, a Group IIIA material or a Group VIA material, such deposition may not be possible on a dopant-bearing film because the dopant-bearing film has very low electrical conductivity. Furthermore, as stated before, the dopant-bearing film may dissolve into the plating electrolyte(s). For electroless deposition techniques dopant-bearing film dissolution into the electroless deposition bath may also present a problem.

Although the present invention is described with respect to certain preferred embodiments, modifications thereto will be apparent to those skilled in the art.

What is claimed is:

1. A system for forming a dopant structure on a frontside of a continuous flexible workpiece, wherein the frontside includes a precursor layer and the dopant structure provides a dopant material that subsequently dopes a solar cell absorber formed by a reaction of the precursor layer and the dopant structure, the system comprising:
a process chamber including a first vapor source station to deposit one of Se material and Na material and a second vapor source station to deposit the other of the Se material and the Na material onto the precursor layer and to form the dopant structure on processed portions of the continuous flexible workpiece, wherein the processed portions of the continuous flexible workpiece provide a protective top surface for the underlying precursor layer;
a moving assembly to hold and move the continuous flexible workpiece within and through the process chamber, including a portion of the continuous flexible workpiece disposed within and being processed by the first and second vapor source stations, by feeding previously unrolled portions of the continuous flexible workpiece from an input end of the process chamber and taking up and wrapping the processed portions of the continuous flexible workpiece at an output end of the process chamber, wherein the protective top surface contacts portions of a backside of the continuous flexible workpiece as the processed portions of the continuous flexible workpiece are wrapped, thereby protecting the precursor layer therebelow, and wherein the moving assembly does not contain any element that contacts a frontside of the continuous flexible workpiece; and
a support assembly that supports by contacting the backside other portions of the continuous flexible workpiece that are disposed within the process chamber, wherein the support assembly includes components that remove the heat from the backside of the other portions of the continuous flexible workpiece that are disposed within the process chamber and prevent any reaction from occurring on the processed portions of the continuous flexible workpiece and thereby avoid formation of the absorber, wherein the components of the support assembly include a set of rollers that each contacts the backside of the continuous flexible workpiece aligned along a curved path within the process chamber, such that none of the components of the support assembly contact the frontside of the continuous flexible workpiece, and wherein the support assembly does not contain any element that contacts the frontside of the continuous flexible workpiece.

2. The system of claim 1, wherein the moving assembly comprises a feed roller adjacent the input end and take-up roller adjacent the output end of the process chamber, wherein the continuous flexible workpiece is unwrapped from the feed roller and wrapped by the take-up roller.

3. The system of claim 1, wherein each roller tensions the continuous flexible workpiece by applying a pressure perpendicular to a backside portion where each roller touches.

4. The system of claim 3, wherein the rollers are biased towards the backside portion by a biasing system including a series of springs.

5. The system of claim 4, wherein the rollers are cooled by a cooling system.

6. The system of claim 1 further including a third vapor source station disposed within the process chamber to deposit Se onto the frontside of the continuous flexible workpiece.

7. The system of claim 1, wherein the components of the support assembly are cooled by a cooling system.

8. The system of claim 1 wherein the first and second vapor source stations are maintained at a pressure of $10^{-4}$- $10^{-6}$ Torr during the process.

9. The system of claim 1 wherein the first and second vapor source stations are activated at the same time.

10. The system of claim 1 wherein the first and second vapor source stations are activated sequentially.

* * * * *